United States Patent
Chiu et al.

(10) Patent No.: US 7,078,351 B2
(45) Date of Patent: Jul. 18, 2006

(54) PHOTORESIST INTENSIVE PATTERNING AND PROCESSING

(75) Inventors: Yuan-Hung Chiu, Taipei (TW); Ming-Huan Tsai, Hsinchu (TW); Hun-Jan Tao, Hsinchu (TW); Jeng-Horng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 158 days.

(21) Appl. No.: 10/361,875

(22) Filed: Feb. 10, 2003

(65) Prior Publication Data

US 2004/0157444 A1 Aug. 12, 2004

(51) Int. Cl.
    *H01L 21/302* (2006.01)
(52) U.S. Cl. .................................................. 438/736
(58) Field of Classification Search ............... 438/624, 438/636, 702, 703, 736–738
    See application file for complete search history.

(56) References Cited

U.S. PATENT DOCUMENTS

| | | | |
|---|---|---|---|
| 5,817,579 A | 10/1998 | Ko et al. ................ 438/740 |
| 6,030,541 A | 2/2000 | Adkisson et al. ............ 216/51 |
| 6,069,091 A | 5/2000 | Chang et al. .............. 438/719 |
| 6,127,089 A * | 10/2000 | Subramanian et al. ... 430/270.1 |
| 6,156,658 A | 12/2000 | Wang et al. ............... 438/688 |
| 6,171,763 B1 | 1/2001 | Wang et al. ............... 430/318 |
| 6,174,818 B1 * | 1/2001 | Tao et al. .................. 438/733 |
| 6,200,907 B1 | 3/2001 | Wang et al. ............... 438/718 |
| 6,248,635 B1 | 6/2001 | Foote et al. .............. 438/287 |
| 6,287,951 B1 | 9/2001 | Lucas et al. .............. 438/618 |
| 6,503,830 B1 * | 1/2003 | Miyata ...................... 438/637 |
| 6,653,735 B1 * | 11/2003 | Yang et al. ................ 257/758 |
| 6,682,996 B1 * | 1/2004 | Blosse ...................... 438/586 |
| 6,720,249 B1 * | 4/2004 | Dalton et al. ............. 438/624 |
| 6,797,552 B1 * | 9/2004 | Chang et al. ............. 438/197 |
| 6,803,313 B1 * | 10/2004 | Gao et al. ................. 438/680 |
| 6,835,663 B1 * | 12/2004 | Lipinski ................... 438/695 |
| 2002/0173163 A1 * | 11/2002 | Gutsche .................... 438/736 |
| 2004/0038537 A1 * | 2/2004 | Liu et al. .................. 438/694 |
| 2004/0079726 A1 * | 4/2004 | Tabery et al. ............... 216/58 |

* cited by examiner

*Primary Examiner*—Jack Chen
(74) *Attorney, Agent, or Firm*—Haynes and Boone, LLP

(57) ABSTRACT

A layer of Anti Reflective Coating (ARC) is first deposited over the surface of a silicon based or oxide based semiconductor surface, a dual hardmask is deposited over the surface of the layer of ARC. A layer of soft mask material is next coated over the surface of the dual hardmask layer, the layer of soft mask material is exposed, creating a soft mask material mask. The upper layer of the dual hardmask layer is next patterned in accordance with the soft mask material mask, the soft mask material mask is removed from the surface. The lower layer of the hardmask layer is then patterned after which the layer of ARC is patterned, both layers are patterned in accordance with the patterned upper layer of the dual hardmask layer. The substrate is now patterned in accordance with the patterned upper and lower layer of the dual hardmask layer and the patterned layer of ARC. The patterned upper and lower layers of the hardmask layer and the patterned layer of ARC are removed from the surface of the silicon based or oxide based semiconductor surface.

7 Claims, 8 Drawing Sheets

PHOTORESIST INTENSIVE PATTERNING AND PROCESSING

BACKGROUND OF THE INVENTION (1) Field of the Invention

The invention relates to the fabrication of integrated circuit devices, and more particularly, to a method of using photoresist whereby photoresist patterning and processing results are not dependent on the thickness of the layer of photoresist.

(2) Description of the Prior Art

Semiconductor device performance continues to be improved by a further reduction in device dimensions. Smaller device dimensions can only be achieved by creating semiconductor devices with smaller and smaller device feature sizes. Included in the continuous reduction of device feature sizes are such device aspects as reducing the spacing between interconnect lines, reducing the width of the interconnect lines, while also affecting feature geometries such as the profiles of cross sections of device features such as isolation regions, via interconnect openings and trenches for interconnect traces.

Problems that are encountered by further decreasing device dimensions are problems imposed by the process of photolithography that is most typically used for the creation of device features. Photolithography is the process whereby a pattern, typically created on the surface of an exposure mask, is transferred to a layer of photoresist. The layer of photoresist (functioning as a radiation sensitive layer of semiconductor material) is uniformly coated over a semiconductor surface, such as the surface of a silicon substrate, after which an exposing source of energy such as optical light, X-rays or an E-beam apparatus) illuminates selected surface areas of the layer of photoresist, preparing this layer of photoresist for selectively being removed from the semiconductor surface. The remaining photoresist comprises, in sharply reduced form, the pattern that is contained on the surface of the exposure mask.

The process of photolithography is an essential process for the creation of semiconductor devices and has, with the evolution of semiconductor devices, seen numerous improvements in its ability to provide desired exposure capabilities that meet current and evolving semiconductor device processing requirements. With further reduction in devices feature dimensions, increased emphasis is placed on focusing resolution and depth of focus of the exposing energy. Some of these problems have been addressed by decreasing the wavelength of the exposing energy source or by increasing the energy of the exposure source or by increasing the time of exposure. With device feature size approaching dimensions of about 0.25 µm or less, acceptable image resolution becomes ever more difficult to achieve. The essential reason for this is that the thickness of the layer of photoresist, which is used for image creation, is typically about 7,000 Angstrom, which inhibits the possibility of creating a sub-micron pattern that has the desired feature resolution. It would therefore appear that this problem could be addressed by reducing the thickness of the applied layer of photoresist. This approach however in turn introduces problems of creating a desired profile of the cross section of the created device features, whereby for instance undesirable corner rounding of this profile becomes an issue. In addition, a thinner layer of photoresist leads to reduced etch protection for an underlying layer of semiconductor material during the process of etching the pattern that is contained in the layer of photoresist into this underlying layer.

It is therefore desired to provide a process or method of photolithographic exposure that results in improved pattern resolution and in improved control of the Critical Dimensions (CD) of the pattern that is being created. The invention provides such a method and procedure.

U.S. Pat. No. 6,248,635 (Foote et al.) shows a dual layer HM and etch process.

U.S. Pat. No. 6,200,907 (Wang et al.), U.S. Pat. No. 6,171,163 (Wang et al.) and U.S. Pat. No. 6,156,659 (Wang et al.) are related dual HM and ARC etch processes.

U.S. Pat. No. 6,069,091 (Chang et al.) shows a Si containing hardmask plasma etch method. This does not have an organic ARC layer and does not remove PR before the etch.

U.S. Pat. No. 6,030,541 (Adkisson et al.) shows a process to pattern an ARC and structure. However, this uses a wet HM etch and does removes the PR before the Poly etch.

SUMMARY OF THE INVENTION

A principle objective of the invention is to provide a method that enables the creation of exposure patterns having deep-submicron feature dimensions.

In accordance with the objectives of the invention a layer of Anti Reflective Coating (ARC) is first deposited over the surface of an oxide based or silicon based semiconductor surface, a dual hardmask is deposited over the surface of the layer of ARC. A layer of photoresist is next coated over the surface of the dual hardmask layer, the layer of photoresist is exposed, creating a photoresist mask. The upper layer of the dual hardmask layer is next patterned in accordance with the photoresist mask, the photoresist mask is removed from the surface. The lower layer of the hardmask layer is then patterned after which the layer of ARC is patterned, both layers are patterned in accordance with the patterned upper layer of the dual hardmask layer. The substrate is now patterned in accordance with the patterned upper and lower layer of the dual hardmask layer and the patterned layer of ARC. The patterned upper and lower layers of the hardmask layer and the patterned layer of ARC are removed from the surface of the oxide based or silicon based semiconductor surface. By varying the sequence and the processing conditions that are highlighted above, the invention provides for four embodiments of the invention.

BRIEF DESCRIPTION OF THE DRAWINGS

FIG. 1 shows a cross section of a substrate, successively deposited over the surface of the substrate have been a layer of ARC deposited over the surface of the substrate, a first layer of a dual hardmask deposited over the surface of the layer of ARC and a second layer of a dual hardmask deposited over the surface of the first layer of a dual hardmask.

FIG. 2 shows a cross section after a photoresist mask has been created over the surface of the second layer of the dual hardmask.

FIG. 3 shows a cross section after the second hardmask layer has been etched in accordance with the overlying photoresist mask; the photoresist mask has been removed from the surface of the second hard mask layer.

FIG. 4 shows a cross section after the first hardmask layer and the layer of ARC have been etched in accordance with the pattern of the second hardmask layer, creating an opening through the hardmask layers and the layer of ARC.

FIG. 5 shows a cross section after the substrate has been etched in accordance with the opening that has been created through the hardmask layers and the layer of ARC.

FIG. 6 shows a cross-section after the patterned layers of hardmask and ARC have been removed from the surface of the substrate.

FIG. 7 shows a cross section of a layer of polysilicon, successively deposited over the surface of the layer of polysilicon have been a layer of ARC deposited over the surface of the substrate, a first layer of a dual hardmask deposited over the surface of the layer of ARC and a second layer of a dual hardmask deposited over the surface of the first layer of a dual hardmask.

FIG. 8 shows a cross section after a photoresist mask has been created over the surface of the second layer of the dual hardmask.

FIG. 9 shows a cross section after the second hardmask layer has been etched in accordance with the overlying photoresist mask; the photoresist mask has been removed from the surface of the second hard mask layer.

FIG. 10 shows a cross section after the first hardmask layer and the layer of ARC have been etched in accordance with the pattern of the second hardmask layer, leaving in place a stack of hardmask layers and the layer of ARC.

FIG. 11 shows a cross section after the layer of polysilicon has been etched in accordance with the stack of hardmask layers and the layer of ARC.

FIG. 12 shows a cross section after stack of hardmask layers and the layer of ARC has been removed from the surface of the layer of polysilicon.

FIG. 13 shows a cross section of a cross section of a semiconductor substrate, successively deposited over the surface of the substrate have been a layer of dielectric, a layer of ARC deposited over the surface of the layer of dielectric, a hardmask layer comprising a first layer of a dual hardmask deposited over the surface of the layer of ARC and a second layer of a dual hardmask deposited over the surface of the first layer of a dual hardmask.

FIG. 14 shows a cross section after a photoresist mask has been created over the surface of the second layer of the dual hardmask.

FIG. 15 shows a cross section after the hardmask layer has been etched in accordance with the overlying photoresist mask.

FIG. 16 shows a cross section after the layer of ARC has been etched in accordance with the pattern of the second hardmask layer, leaving in place a stack of hardmask layers and the layer of ARC.

FIG. 17 shows a cross section after the photoresist mask has been removed from the surface of the hard mask layer.

FIG. 18 shows a cross section after the layer of dielectric has been etched in accordance with the stack of hardmask layers and the layer of ARC.

FIG. 19 shows a cross section after stack of hardmask layers and the layer of ARC has been removed from the surface of the layer of dielectric.

FIG. 20 shows a cross section of a cross section of a semiconductor substrate, successively deposited over the surface of the substrate have been a layer of dielectric, a layer of ARC deposited over the surface of the layer of dielectric, a hardmask layer comprising a first layer of a dual hardmask deposited over the surface of the layer of ARC and a second layer of a dual hardmask deposited over the surface of the first layer of a dual hardmask.

FIG. 21 shows a cross section after a photoresist mask has been created over the surface of the second layer of the dual hardmask.

FIG. 22 shows a cross section after the hardmask layer has been etched in accordance with the overlying photoresist mask.

FIG. 23 shows a cross section after the layer of ARC has been etched in accordance with the pattern of the second hardmask layer, leaving in place a stack of hardmask layers and the layer of ARC, the photoresist mask has been removed from the surface of the hard mask layer in-situ with the etch of the layer of ARC.

FIG. 24 shows a cross section after the layer of dielectric has been etched in accordance with the stack of hardmask layers and the layer of ARC.

FIG. 25 shows a cross section after stack of hardmask layers and the layer of ARC has been removed from the surface of the layer of dielectric.

DESCRIPTION OF THE PREFERRED EMBODIMENTS

The invention addresses creating a deep-submicron pattern in a semiconductor surface, this semiconductor surface can be silicon based, forming the surface of a silicon substrate, or can be oxide based such as the surface of a polysilicon layer. The first sequence of figures, that is FIGS. 1 through 6, addresses the processing of a silicon based surface under the first embodiment of the invention. The second sequence of figures, that is FIGS. 7 through 12, addresses the processing of a silicon based surface under the second embodiment of the invention.

Figure 1:
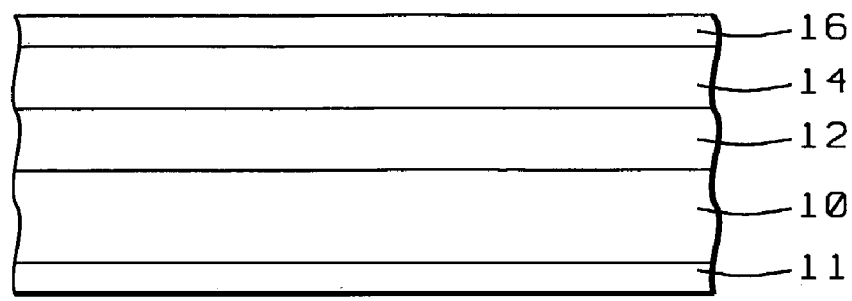
FIGS. 1 through 6 show the first embodiment of the process of the invention whereby the photoresist is removed over the surface area of the substrate into which a pattern is to be etched, as follows.

Referring now specifically to the cross section that is shown in FIG. 1, there is shown:

10, the cross section of an oxide based semiconductor surface, into which a deep sub-micron pattern is to be created 11, the remainder of the oxide based semiconductor surface into which a deep submicron pattern is to be created; layer 11 is shown to avoid images of etching through the layer 10, the etch of the invention is into but not completely through the oxide based semiconductor surface 12, a layer of ARC deposited over the surface of the oxide based layer 10; the preferred material of the invention for layer 12 is CVD BARC comprising amorphous carbon 14, a first layer of hardmask material that has been deposited over the surface of layer 12 of ARC/CVD BARC, and 16, a second layer of hardmask material that has been deposited over the surface of the first hardmask layer 14.

Oxide based substrate 10 is a substrate that is used is the fabrication of microelectronic devices and can therefore be selected from a group of microelectronic device processes that is selected from the group without being limited to the group of Integrated Circuit microelectronic fabrication, solar cell microelectronic fabrication, ceramic substrate based microelectronic fabrication and flat-panel microelectronic fabrication. It is further to be understood that, although substrate 10 has been shown as a blank oxide layer, there may also have been created in or on the surface of layer 10 interconnect traces and other components or parts thereof that may be applied for the creation of a functional semiconductor device or package.

The blanket layer 12 may be formed from any of the Anti Reflective Coating materials that are common in the art of microelectronic fabrication. Layer 12 comprises a layer of organic ARC, such a layer typically absorbs light, thereby minimizing reflection, making this layer suitable in an application for creating deep-submicron device features.

The application of layers of ARC has largely been stimulated by continuing drive in the semiconductor industry toward integrated circuits with ever decreasing device geometries. The decrease in device geometries, coupled with the frequent use of highly reflective materials such as polysilicon, aluminum and metal suicides, has led to photolithographic patterning problems such as unwanted light reflections that are introduced by underlying reflective materials during the photoresist patterning process, which often cause the resulting photoresist pattern to be distorted.

Anti-reflective coatings (ARC's) have been developed to minimize the adverse impact due to reflectance from these reflective materials. In many instances, these ARC's are conductive materials which are deposited as a blanket layer on top of metal and simultaneously patterned with the metal to form interconnects.

Some dielectric ARC's, such as silicon rich silicon nitride or aluminum nitride, are most suitable for deep ultraviolet (DUV) radiation. A majority of photolithography steps occurs at higher wave lengths, such as I-line or G-line exposures, where silicon-rich silicon nitride or aluminum nitride are not optimal materials to be used for ARC's.

ARC materials are opaque and are, as stated, useful as non-reflective coatings when formed over reflecting surfaces. There is also the so-called bottom-anti-reflective coating (BARC) which can be either opaque or translucent, and yet not reflect, nor transmit electromagnetic radiation. Therefore, BARC can be placed below or at the "bottom" of a layer, and yet not transmit radiation to a still lower layer, such as a silicon substrate, underneath the BARC.

An ARC layer is typically formed through a spin coating method as is conventional in the art followed by a thermal cure at a temperature of about 120 degrees C. for a time period of about 90 seconds to yield a blanket focusing layer when cured of a thickness of between about 300 and 1500 angstrom. A common ARC is TiN, which may be deposited by sputtering, possible materials that can be used for the ARC layer of the invention are cryolite and MgF. It must thereby also be realized that the layer of ARC can contain more than one layer of material.

With respect to the blanket layer 14 of hardmask material, the preferred material of the invention is SiN or SiON. The term "hardmask" is known in the art as referring to an inorganic masking material. The layer of hard mask can be of silicon dioxide obtained from TEOS. The TEOS is deposited by CVD or PECVD to a thickness of about 100 to about 1,000 A. and more typically to a thickness between about 400 and 600 A. The TEOS is reacted with oxygen or ozone to provide the silicon oxide hard mask material. Other hard mask materials include phosphosilicate glass (PSG), borophosphosilicate (BPSI), silicon oxynitride and thermally grown silicon dioxide.

The preferred material of the invention for the first layer 14 of hardmask material comprises silicon nitride ($Si_3N_4$) or silicon oxynitride (SiON). A silicon nitride layer can be formed using any suitable technique including CVD techniques, such as LPCVD of PECVD. The silicon nitride layer 14 can be created using a one step PECVD or LPCVD technique such as simultaneously employing gasses containing silicon and nitrogen, such as using $SiH_4$ of $SiCl_2H_2$ and $N_2$ or $NH_3$. The silicon nitride layer 14 can also be created using LPCVD techniques ($SiCl_2H_2$ and $NH_3$) containing $Si_3N_4$.

Layer 14 of Silicon Oxynitride typically has as formula $SiO_xN_y(H_z)$. Silicon Oxynitrides are formed by creating $SiH_4$ with $N_2O$ and $NH_3$. In order to form a non-conformal layer of SiON, a practical application uses $SiO_xN_y$ deposited by PECVD with a gas flow between about 1700 and 2300 sccm of He, a gas flow of between about 80 and 120 sccm of $N_2O$, a gas flow of between about 40 and 200 sccm of $SiH_4$, at a temperature of between about 380 and 480 degrees C. and at a pressure between about 5 and 8 Torr. A typical carrier gas for the formation of a layer of $SiO_xN_y$ is $N_2$ or He.

The preferred materials of the invention for the dual hardmask layer comprises materials selected from the group consisting of silicon dioxide, silicon nitride and silicon oxynitride or a combination thereof. As an example of the upper layer 16 of the dual layer hardmask can be cited using a layer of silicon oxide, deposited by PECVD. Other deposition means may alternatively be used to deposit this layer. However, PECVD is preferred because of the low deposition temperature. PECVD silicon oxide may be deposited at temperatures between 200 and 350 degrees C. for $SiH_4/O_2$ or $SiH_4/N_2O$ precursors. The silicon oxide layer is deposited to a thickness of between about 1,500 and 3,000 Angstrom.

Figure 2:
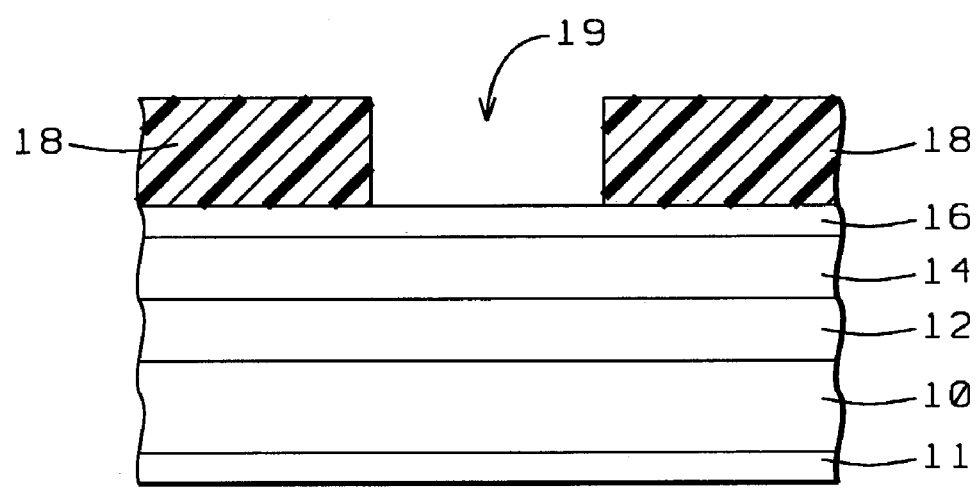

FIG. 2 shows a cross section after a photoresist mask 18 has been formed over the surface of the upper hardmask layer 16. The photoresist mask 18 has an opening 19 created in the layer of photoresist, this opening exposes the surface of the upper hardmask layer 14 over a surface area that aligns with the surface area of the substrate 10 into which an opening of deep-sub-micron dimensions is to be created. The material that is selected for the layer 18 of photoresist may be a positive or a negative photoresist material. The patterned layer 18 of photoresist-may be formed to a thickness and with an aperture width desired to form an opening of deep-submicron dimensions in the surface of substrate 10.

The preferred methods of the invention for the patterning and developing of the photoresist layer 18 comprises a method that is selected from the group consisting of photolithography, E-beam, X-ray and laser technologies.

It is known in the art that small wavelength radiation increases precision and thus the ability to improve critical dimension control. Specific examples of wavelengths to which the ultra-thin photoresist are sensitive include about 248 nm, about 193 nm, about 157 nm, about 13 nm about 11 nm and about 1 nm. Specific sources of radiation include KrF excimer lasers having a wavelength of about 248 nm, a XeHg vapor lamp having a wavelength of about 200 nm to about 250 nm, mercury-xenon arc lamps having a wavelength of about 248 nm, an ArF excimer laser having a wavelength of about 193 nm, an F2 excimer laser having a wavelength of about 157 nm, extreme UV light having a wavelengths of about 13.5 nm and/or 11.4 nm, and X-rays having a wavelength of about 1 nm. The mercury vapor lamps that are used in exposure equipment for integrated chip fabrication have an emission spectrum of non-uniform intensity with several intense, sharp lines. In the UV wavelength range from 350 to 450 nanometers (nm), there are three strong lines, the I-line (365 nm), the H-line (405 nm) and the G-line (436 nm).

The photoresist mask 18, which is shown in cross section in FIG. 2, is preferably removed applying by plasma etching and methods of wet chemical strip. These same methods may be applied for the creation of the opening 19 through the layer 18 of photoresist. The plasma etching preferably comprises in-situ and ex-situ processes.

As examples used in stripping photoresist 18 or in cleaning a wafer surface after the photoresist 18 has been stripped by other means can be cited the use of sulfuric acid ($H_2SO_4$) and mixtures of $H_2SO_4$ with other oxidizing agents such as hydrogen peroxide ($H_2O_2$). For instance, a frequently used mixture is seven parts $H_2SO_4$ to three parts of 30% $H_2O_2$ or a mixture of 88% sulfuric acid and 12% nitric acid. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The photoresist layer 18 can be partially removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

Figure 3:
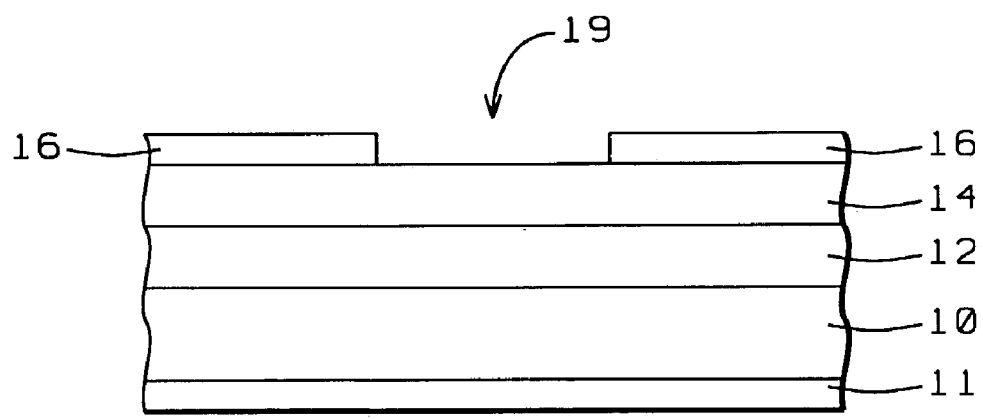
Figure 4:
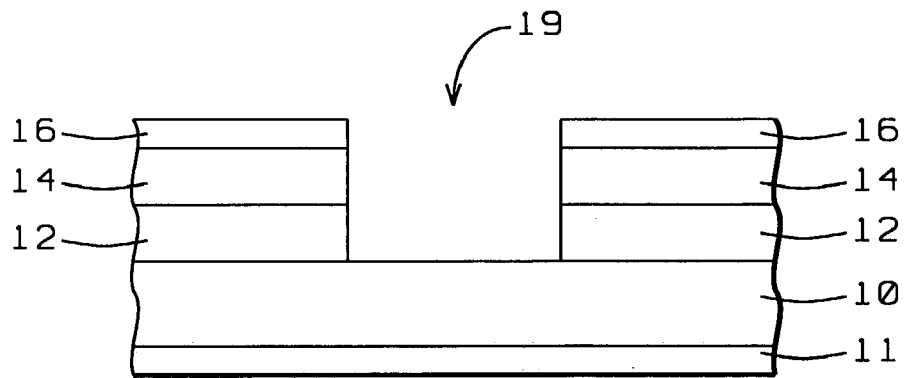

Continuing next with the cross section that is shown in FIG. 3, there is shown the results that have been obtained after etching the second layer 16 of the dual hardmask layers in accordance with the photoresist mask 18. As an example of etching the upper layer 16 can be cited etching a layer of silicon oxide by RIE or anisotropic plasma etching by using an etchant containing fluorocarbon, for example $CF_4$ or $CHF_3$.

Alternatively, to remove an upper layer 16 consisting of silicon oxide, an isotropic plasma etching can be applied in an etchant comprising fluorocarbons, performed in a parallel HDP reactor in-situ, in a plasma containing $CF_4$ at a flow rate of between about 30 and 60 sccm, in an organ carrier gas at a flow rate sufficient to maintain a pressure between about 5 and 15 mTorr said HDP reactor and at an rf power of between about 400 and 1,200 Watts TCP and between about 1,000 and 1,500 Watts bias.

Alternatively still, to remove the upper layer 16 consisting of silicon oxide of the dual hardmask layer, an isotropic plasma etching can be applied in an etchant comprising $SF_6$, performed in a parallel HDP reactor in-situ, in a plasma containing $CF_4$ at a flow rate of between about 30 and 60 sccm, in an organ carrier gas at a flow rate sufficient to maintain a pressure between about 5 and 15 mTorr said HDP reactor and at an rf power of between about 400 and 1,200 Watts TCP and between about 1,000 and 1,500 Watts bias.

The preferred methods of the invention for the removal of the upper layer 16 of the dual hardmask layers comprise applying a dry etch or a wet etch process.

The cross section of FIG. 3 shows that the removal of the upper layer 16 in accordance with opening 19 creates a mask of the upper layer 16 of hardmask material overlying the lower layer 14 of hardmask material. This mask is subsequently used for the removal of layers 14, the lower layer of hardmask material, and layer 12 of ARC material, see FIG. 4.

As an example of the removal of a layer 14 of SiON can be cited exposing layer 14 to a recipe comprising $O_2$, at a flow rate between 10 and 100 sccm, and $N_2$, at a flow rate between 10 and 100 sccm, for a period between about 30 and 60 seconds. Layer 12 of BARC can be removed following the same recipe to this layer 12.

The preferred method of the invention for the removal of the lower layer 14 of the dual hardmask layers comprises applying a dry etch or a wet etch process.

Figure 5:
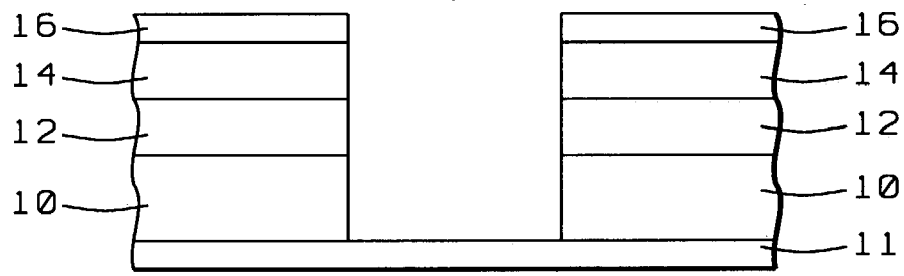
Figure 6:
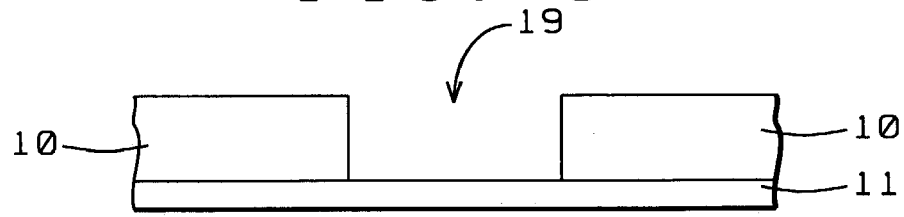

Using the patterned layers 12, 14 and 16 is a mask, FIG. 5, the substrate 10 is next etched, preferably by applying a dry or a wet etch process to the oxide based substrate layer 10. This final etch has created in opening 19, FIG. 6, in substrate layer 10, of deep-submicron dimensions. At this time, after the completion of the stated objective of the invention, the mask consisting of patterned layers 12, 14 and 16 are removed from the surface of substrate layer 10, a process that is preferably performed applying plasma etching and wet chemical strip processes. For the application of plasma etching, the layer 12 of ARC is preferably removed applying in-situ and ex-situ processes to this layer 12 of ARC.

The processing sequence that is shown in cross sectional representation in FIGS. 7 through 12 is similar to the previously shown and explained processing sequence of FIGS. 1 through 6. Since a significant number of these processing steps are identical, specific conditions that apply to the processing conditions are they are performed for FIGS. 7 through 12 will not be repeated. The significant difference between the processing sequence as explained under FIGS. 1 through 6 and the processing sequence as applied to the cross sections of FIGS. 7 though 12 is that the first processing sequence, of FIGS. 1 through 6, is for an oxide based substrate layer 10 while the processing sequence of FIGS. 7 through 12 applies to an silicon based layer 20/21.

Figure 7:
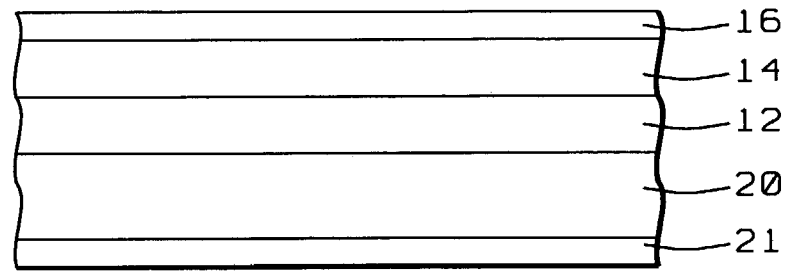
FIGS. 7 through 12 show the second embodiment of the process of the invention whereby the photoresist remains in place over the surface area of a layer of polysilicon into which a pattern is to be etched, as follows.

FIG. 7 shows a cross section of a layer 20 of polysilicon, successively deposited over the surface of the layer of polysilicon have been a layer 12 of ARC deposited over the surface of the layer 20 of polysilicon, a first layer 14 of a dual hardmask deposited over the surface of the layer 12 of ARC and a second layer 16 of a dual hardmask deposited over the surface of the first layer of a dual hardmask. Layer 21 has been shown in the cross section of FIG. 7 for the same reason as layer 11 has been shown in the cross sections of FIGS. 1 through 6, that is to avoid etching all the way through the layer 20 of polysilicon.

Layer 20 of polysilicon can be deposited using LPCVD procedures at a temperature between about 500 and 600 degrees C. to a thickness between about 2,000 and 4,000 Angstrom.

Figure 8:
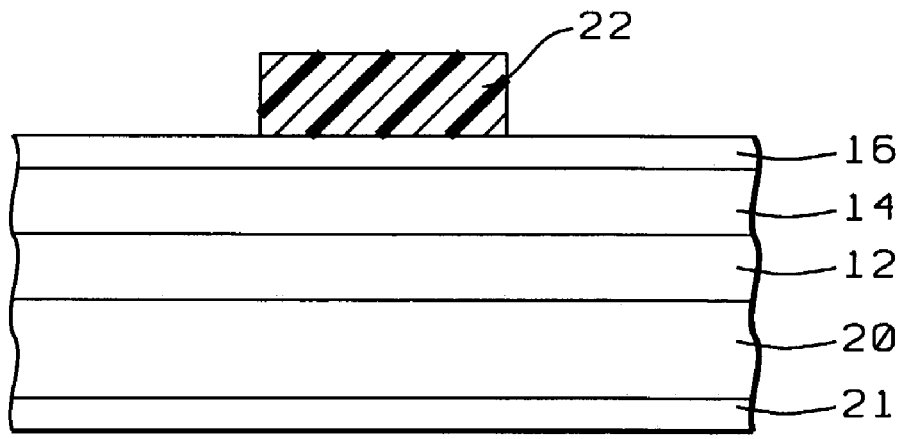

FIG. 8 shows a cross section after a photoresist mask 22 has been created over the surface of the second layer of the dual hardmask. The same conditions and limitations of processing apply to the creation of the photoresist mask 22 as have previously been enumerated with respect to the creation of the photoresist mask 18 of FIG. 2.

Figure 9:
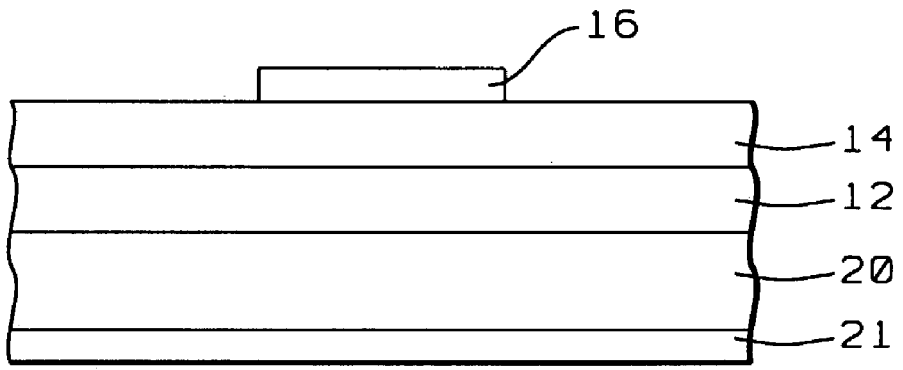

FIG. 9 shows a cross section after the second hardmask layer 16 has been etched in accordance with the overlying photoresist mask 22; the photoresist mask 22 has been removed from the surface of the second hard mask layer 16. The same conditions and limitations of processing apply to the etching of the upper layer 16 of the hardmask layer and the removal of the photoresist mask 22 creation of the photoresist mask 22 as have previously been enumerated with respect to the etching of upper layer 16 in FIG. 3 and the removal of photoresist mask 18 of FIG. 3.

Figure 10:
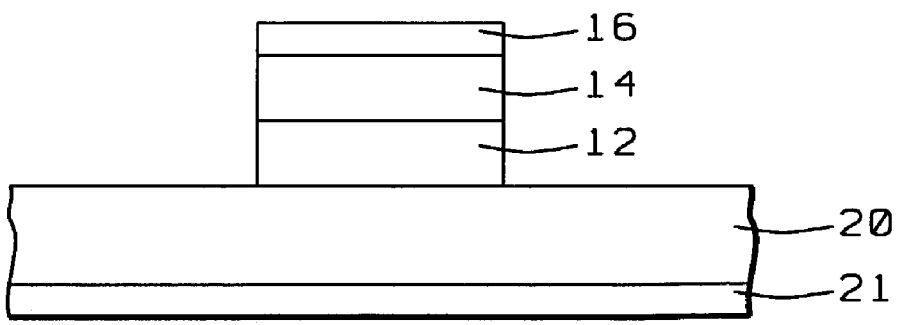

FIG. 10 shows a cross section after the first hardmask layer 14 and the layer 12 of ARC have been etched in accordance with the pattern of the second hardmask layer, leaving in place a stack 16 and 14 of hardmask layers and the layer 12 of ARC. The same conditions and limitations of processing apply to the etching of the lower layer 14 of the hardmask layer and the removal of layer 12 of ARC as have previously been enumerated with respect to the etching of lower layer 14 in FIG. 3 and the removal of the layer 12 of ARC of FIG. 4.

Figure 11:
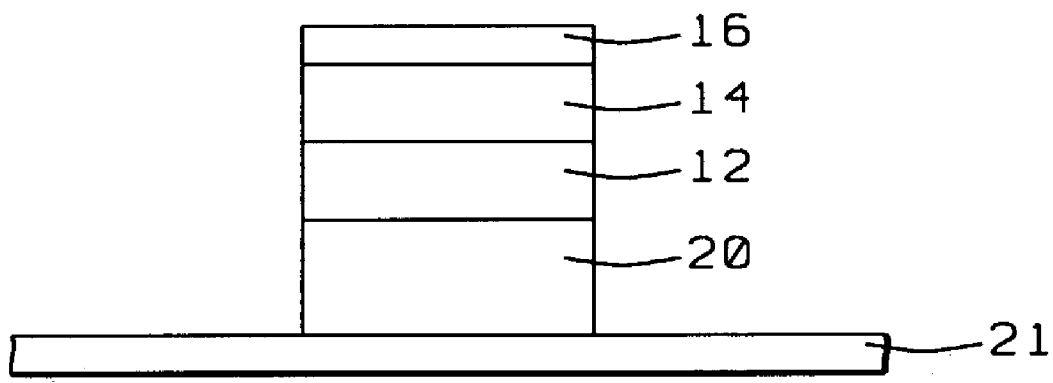

FIG. 11 shows a cross section after the layer 20 of polysilicon has been etched in accordance with the stack 61, 14 of hardmask layers and the layer 12 of ARC. Layer 20 of polysilicon can be etched by applying $SF_6$ and $SiO_2$ to the surface of layer 20.

Figure 12:
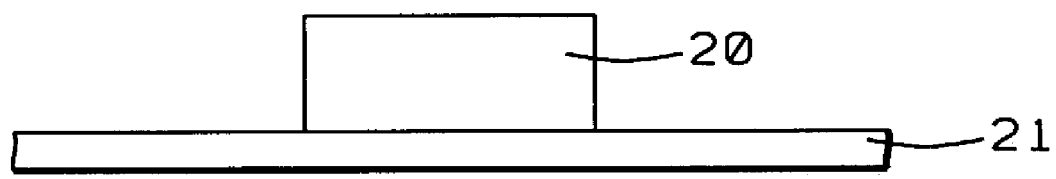

FIG. 12 shows a cross section after stack of hardmask layers 16 and 14 and the layer 12 of ARC has been removed from the surface of the layer of polysilicon. The same conditions and limitations of processing apply to the etching of the removal of the stack of hardmask layer 16 and 14 and the removal of the patterned layer 12 of ARC material as previously been enumerated with respect to the removal of the stacked layer 16 and 14 and the removal of the layer 12 of ARC of FIG. 5.

The same processing conditions apply to the processing sequence that has been highlighted using FIGS. 7 though 12 as previously have been highlighted for the processing sequence of FIGS. 1 through 6, that is:

- the dual hardmask layer comprise materials selected from the group consisting of silicon dioxide, silicon nitride, silicon oxynitride and combinations thereof
- the preferred methods of the invention for the patterning and developing of the photoresist layer 22, FIG. 8, comprises a method that is selected from the group consisting of photolithography, E-bean, X-ray and laser technologies.
- the preferred method for patterning the upper layer of the dual hardmask layers comprises dry etch and wet etch procedures
- the preferred method for removing the photoresist mask 22 from the surface of the upper layer of the dual layer hardmask comprises plasma etching and wet chemical strip
- where the plasma etching is used for the removal of the photoresist mask 22, this plasma etch comprises in-situ and ex-situ plasma etch processes
- the patterning of the lower layer of the dual hardmask and the organic layer of ARC comprises applying a dry etch or a wet etch process
- the patterning of the layer 20 comprises a dry etch or a wet etch process
- the removal of the organic ARC layer comprises plasma etching and wet chemical strip, and
- where plasma etching is applied for the removal of the organic ARC layer, this plasma etching comprises in-situ and ex-situ processes.

The third embodiment of the invention will be highlighted using FIGS. 13 through 19. These figures will be highlighted in summary form since many of the details that apply to the various processing steps that apply to the third embodiment of the invention have previously been explained in detail.

Figure 13:
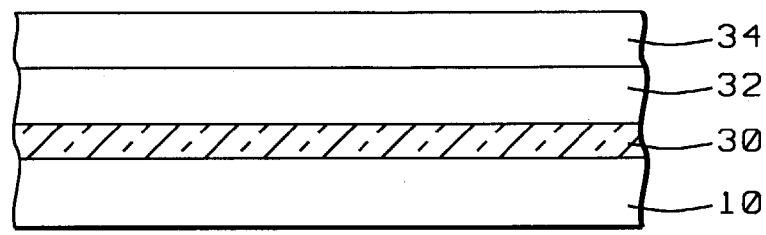
FIGS. 13 through 19 show the third embodiment of the invention, as follows.

FIG. 13 shows a cross section of a cross section of a semiconductor substrate 10, successively deposited over the surface of the substrate have been a layer 30 of oxide-based dielectric, a layer 32 of ARC deposited over the surface of the layer of dielectric, a hardmask layer 34 comprising a first layer of a dual hardmask deposited over the surface of the layer of ARC and a second layer of a dual hardmask deposited over the surface of the first layer of a dual hardmask. The first and second layers of hardmask material have not been differentiated in the cross section that is shown in FIG. 13 since layer 34 of hardmask material may comprise one or two layers of hardmask material.

The ARC layer 32 may comprise an organic ARC material that is selected from the group consisting of amorphous carbon and nitrogen doped amorphous carbon and organic material comprising carbon and hydrogen and nitrogen.

The layer 32 of ARC is preferably deposited applying methods of CVD, thereby using a precursor gas of the chemical composition of $C_xH_y$, such as $C_3F_6$.

The layer 34 of hardmask material comprises a material selected from the group consisting of silicon dioxide and silicon nitride and silicon oxynitride or combinations thereof.

As an extension of the third embodiment of the invention, a layer of etch stop material (not shown in FIG. 13) may be deposited over the surface of the layer 30 of dielectric. This layer of etch stop material serves as an etch stop for the layer 32 of ARC. This etch stop layer may comprise a material selected from the group consisting of silicon nitride, silicon oxynitride and silicon carbide.

Figure 14:
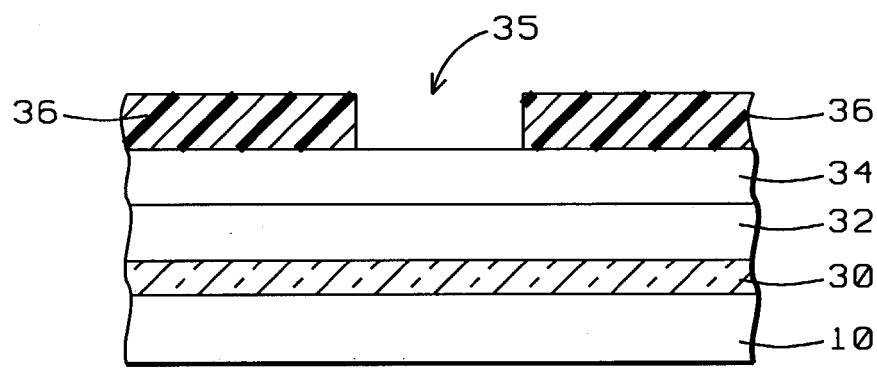

FIG. 14 shows a cross section after a photoresist mask 36 with an opening 35 has been created over the surface of the layer 34 comprising (a single or dual layer of) hardmask material.

The photoresist mask 36 may be created by applying 248 nm or 193 nm or 157 nm or E-beam or X-ray lithography technology.

Figure 15:
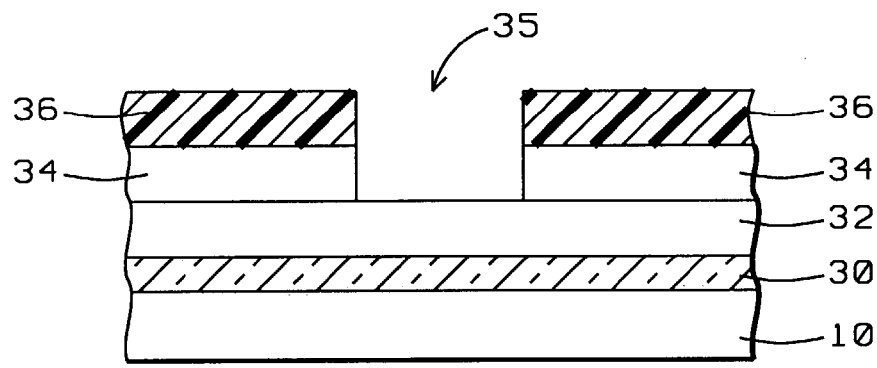

FIG. 15 shows a cross section after the hardmask layer 34 has been plasma etched in accordance with the overlying photoresist mask 36.

Figure 16:
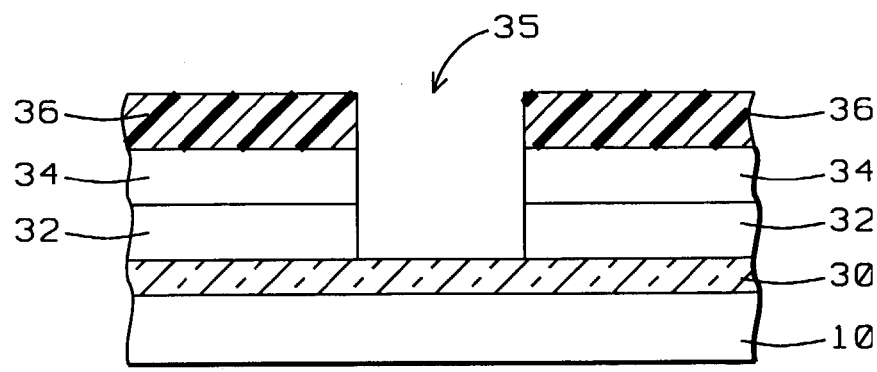

FIG. 16 shows a cross section after the layer 32 of ARC has been plasma etched in accordance with the pattern of the second hardmask layer 34, leaving in place a stack of hardmask layers 34 and the layer 32 of ARC.

For applications where the previously highlighted layer of etch stop material (not shown) has been deposited over the surface of the layer 30 of dielectric, this layer of etch stop material is etched after the layer 32 of ARC has been etched. The layer of etch stop material is etched in accordance with the pattern formed by the stack of hardmask layers 34 and the layer 32 of ARC.

Figure 17:
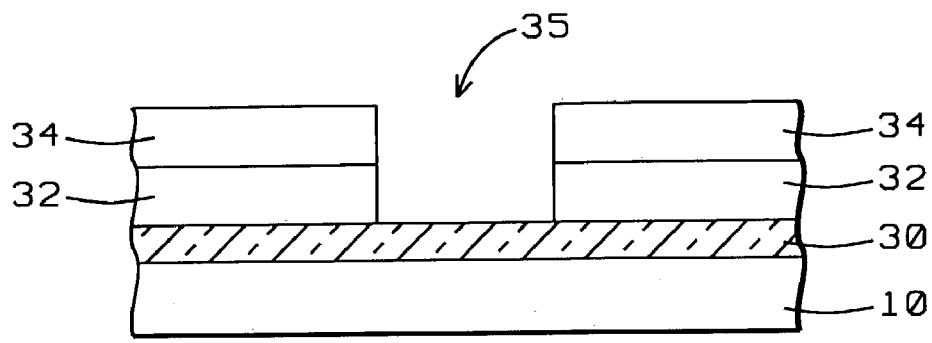

FIG. 17 shows a cross section after the photoresist mask 36 has been removed from the surface of the hard mask layer 34.

Figure 18:
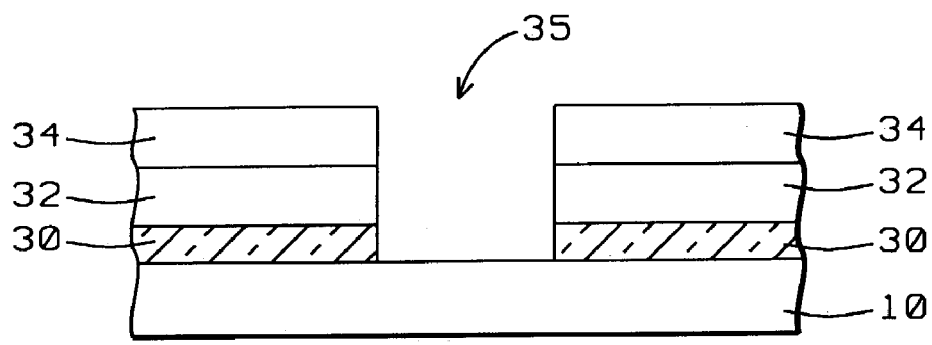

FIG. 18 shows a cross section after the layer 30 of dielectric has been plasma etched in accordance with the stack of hardmask layers 34 and the layer 32 of ARC.

Figure 19:
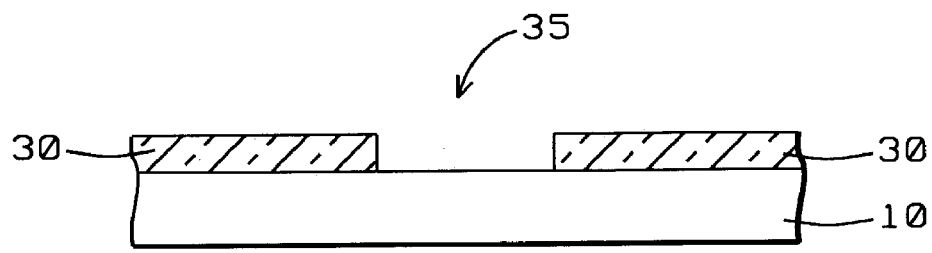

FIG. 19 shows a cross section after stack of hardmask layers 34 and the layer 32 of ARC have been removed from the surface of the layer 30 of dielectric.

The process that is applied for the removal of the layer 32 of ARC material may consist of plasma etching comprising in-situ and ex-situ processes.

The fourth embodiment of the invention will be highlighted using FIGS. 20 through 25. These figures will be highlighted in summary form since many of the details that apply to the various processing steps that apply to the fourth embodiment of the invention have previously been explained in detail.

Figure 20:
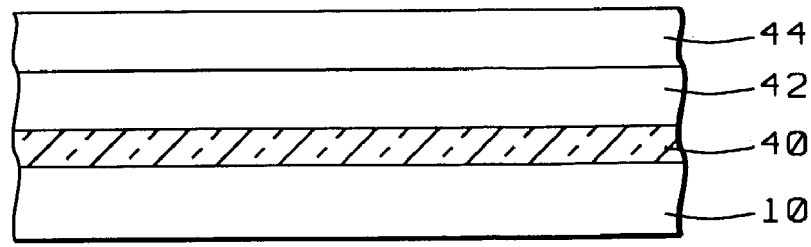
FIGS. 20 through 25 show the fourth embodiment of the invention, as follows.

FIG. 20 shows a cross section of a cross section of a semiconductor substrate 10, successively deposited over the surface of the substrate have been a layer 40 of oxide-based dielectric, a layer 42 of organic ARC deposited, using methods of CVD, over the surface of the layer 40 of dielectric, a hardmask layer 44 comprising a first layer of a dual hardmask deposited over the surface of the layer of ARC and a second layer of a dual hardmask deposited over the surface of the first layer of a dual hardmask. The first and second layers of hardmask material have not been differentiated in the cross section that is shown in FIG. 20 since layer 44 of hardmask material may comprise one or two layers of hardmask material.

Figure 21:
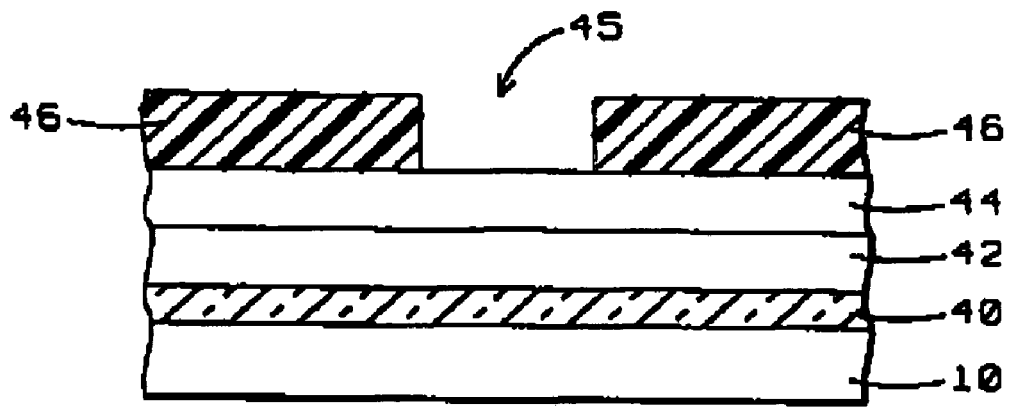

FIG. 21 shows a cross section after a photoresist mask 46 has been created over the surface of the layer 44 comprising (a single or dual layer of) hardmask material.

Figure 22:
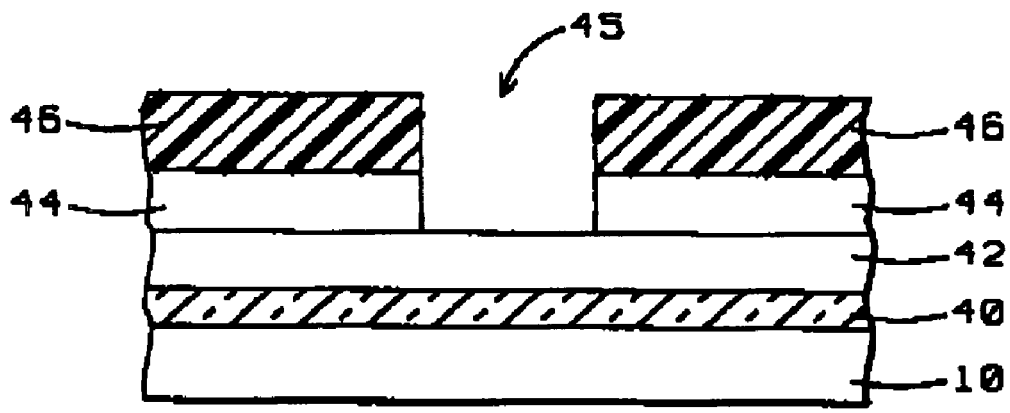

FIG. 22 shows a cross section after the hardmask layer 44 has been plasma etched in accordance with the overlying photoresist mask 46.

The preferred chemistry for the removal by plasma etch of the hardmask layer 44 comprises:

a fluorine containing gas of the chemical composition of $C_xF_y$ such as $C_4F_8$ or $C_5F_8$ or $C_4F_6$ or $C_3F_6$ or $C_2F_6$ or $CF_4$ with an inert gas such as Ar or He or Ne with a weak oxidant such as CO or $O_2$ or a fluorine containing gas of the chemical composition of $C_xH_yF_z$ such as $CHF_3$ or $CH_2F_2$ or $CH_3F$ with an inert gas such as Ar or He or Ne with a weak oxidant such as CO or $O_2$.

Figure 23:
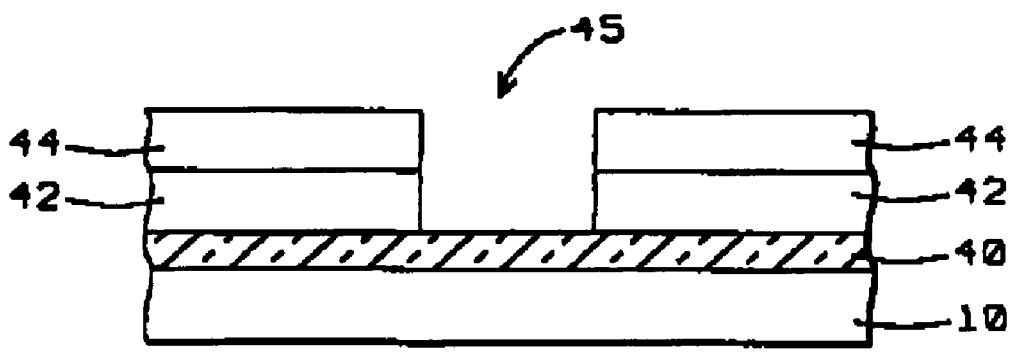

FIG. 23 shows a cross section after the layer 42 of ARC has been plasma etched in accordance with the pattern of the second hardmask layer 44, leaving in place a stack of hardmask layers 44 and the layer 42 of ARC, the photoresist mask 46 has been removed in-situ from the surface of the hard mask layer 44 as part of the etch of the layer 42 of ARC.

The etch chemistry of plasma etch of the layer 42 of ARC comprises:

$O_2$ or $O_2$ plus CO or $O_2$ plus CO plus an inert gas such as Ar or He or Ne $O_2$ plus $N_2$ or $O_2$ plus $N_2$ plus an inert gas such as Ar or He or Ne or $O_2$ plus CO plus $N_2$ or $O_2$ plus CO plus $N_2$ plus an inert gas such as Ar or He or Ne or $N_2$ plus $H_2$.

Figure 24:
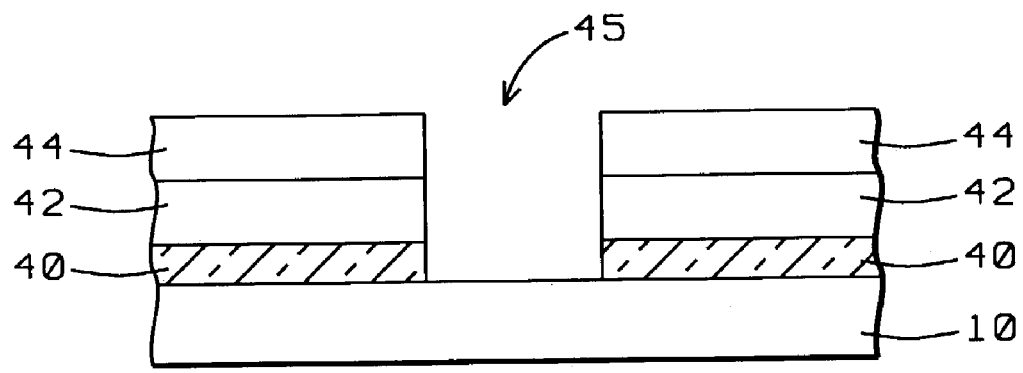

FIG. 24 shows a cross section after the layer 40 of oxide-based dielectric has been plasma etched in accordance with the stack of hardmask layers 44 and the layer 42 of ARC.

The etching chemistry for the etching of layer 40 of oxide-based dielectric, for the creation of contact hole 45, comprises:

a fluorine containing gas of the chemical composition of $C_xF_y$ such as $C_4F_8$ or $C_5F_8$ or $C_4F_6$ or $C_3F_6$ or $C_2F_6$ or $CF_4$ plus an inert gas such as Ar or He or Ne plus a weak oxidant such as CO or $O_2$ or a fluorine containing gas of the chemical composition of $C_xF_z$ such $C_4F_8$ or $C_5F_8$ or $C_4F_6$ or $C_3F_6$ or $C_2F_6$ or $CF_4$ plus an inert gas such as Ar or He or Ne plus a weak oxidant such as CO or $O_2$ plus a fluorine containing gas $C_xH_yF_z$ such as $CHF_3$ or $CH_2F_2$ or $CH_3F$ or a fluorine containing gas $C_xF_z$ such $C_4F_8$ or $C_5F_8$ or $C_4F_6$ or $C_3F_6$ or $C_2F_6$ or $CF_4$ plus an inert gas such as Ar or He or Ne plus $N_2$ or a fluorine containing gas $C_xF_z$ such $C_4F_8$ or $C_5F_8$ or $C_4F_6$ or $C_3F_6$ or $C_2F_6$ or $CF_4$ plus an inert gas such as Ar or He or Ne plus Nor plus a weak oxidant such as CO or $O_2$ or a fluorine containing gas $C_xF_z$ such $C_4F_8$ or $C_5F_8$ or $C_4F_6$ or $C_3F_6$ or $C_2F_6$ or $CF_4$ plus an inert gas such as Ar or He or Ne plus a weak oxidant such as CO or $O_2$ plus fluorine containing gas $C_xH_yF_z$ such as $CHF_3$ or $CH_2F2$ or $CH_3F$ plus $N_2$ or a fluorine containing gas $C_xF_z$ such $C_4F_8$ or $C_5F_8$ or $C_4F_6$ or $C_3F_6$ or $C_2F_6$ or $CF_4$ plus an inert gas such as Ar or He or Ne plus fluorine containing gas $C_xH_yF_z$ such as $CHF_3$ or $CH_2F2$ or $CH_3F$.

Figure 25:
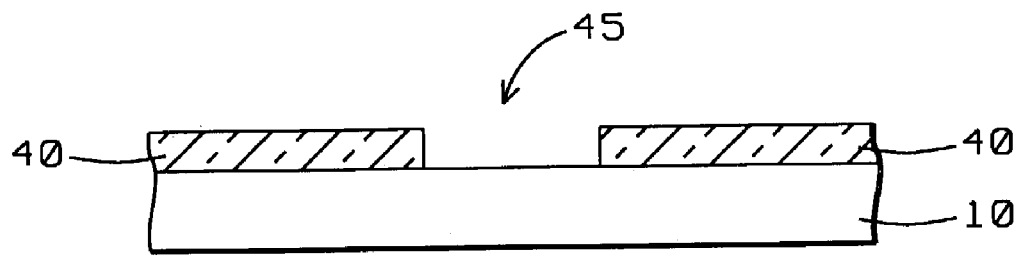

FIG. 25 shows a cross section after stack of hardmask layers 44 and the layer 42 of ARC have been removed from the surface of the layer 40 of dielectric. The remaining hardmask layer 44 and the layer 42 of ARC can be removed in-situ or ex-situ.

The methods of the invention for patterning a semiconductor surface by applying etch processes can be summarized as follows:

the invention starts with providing a substrate having a silicon based layer over the surface thereof a layer of Anti Reflective Coating is deposited over the surface of said silicon based layer a first layer of hardmask material is deposited over the surface of said layer of ARC material followed by depositing a second layer of hardmask material over the surface of said first layer of hardmask material a layer of photoresist is coated over the surface of said second layer of hardmask material at least one opening is created through said layer of photoresist that aligns with at least one surface area in the surface of said silicon based layer into which at least one opening is to be etched, said developed layer of photoresist forming an etch mask, exposing the surface of said second layer of hardmask material at least one opening is created through said second layer of hardmask material the photoresist etch mask is removed from the surface of said second layer of hardmask material the first layer of hardmask material and said layer of ARC material are etched in accordance with said at least one opening created through said second layer of hardmask material, completing at least one opening through said second layer of hardmask material, said first layer of hardmask material and said layer of ARC material the silicon based layer is etched in accordance with said at least one opening created through said second layer of hardmask material, said first layer of hardmask material and said layer of ARC material, and the patterned second layer of hardmask material, said patterned first layer of hardmask material and said patterned layer of ARC material are removed from the surface of said silicon based layer.

An alternate method of the invention for patterning a semiconductor surface by applying etch processes can be summarized as follows:

the alternate method starts with providing a substrate, said substrate having been provided with a oxide based layer of semiconductor material over the surface thereof a layer of Anti Reflective Coating is deposited over the surface of said oxide based layer of semiconductor material a dual hardmask layer comprising two layers of hardmask material is created by successively depositing a first layer of hardmask material over the surface of said layer of ARC material followed by depositing a second layer of hardmask material over the surface of said first layer of hardmask material a layer of photoresist is coated over the surface of said second layer of hardmask material the layer of photoresist is patterned and developed, creating at least one opening through said layer of photoresist that aligns with at least one surface area in the surface of said oxide based layer of semiconductor material into which at least one opening is to be etched, said developed layer of photoresist forming an etch mask, exposing the surface of said second layer of hardmask material the exposed surface of said second layer of hardmask material is etched, creating at least one opening through said second layer of hardmask material the photoresist etch mask is removed from the surface of said second layer of hardmask material the first layer of hardmask material and said layer of ARC material are etched in accordance with said at least one opening created through said second layer of hardmask material, completing at least one opening through said second layer of hardmask material, said first layer of hardmask material and said layer of ARC material the oxide based layer of semiconductor material is etched in accordance with said at least one opening created through said second layer of hardmask material, said first layer of hardmask material and said layer of ARC material, and the second layer of hardmask material, said patterned first layer of hardmask material and said patterned layer of ARC material are removed from the surface of said oxide based layer of semiconductor material.

Yet another method of the invention for patterning a semiconductor surface by applying etch process can be summarized as follows.

provide a substrate, said substrate having been provided with a silicon based layer of semiconductor material over the surface thereof deposit a layer of Anti Reflective Coating (ARC) material over the surface of said silicon based layer of semiconductor material create a layer of hardmask material over the surface of said layer of ARC material coat a layer of photoresist over the surface of said layer of hardmask material pattern and develop said layer of photoresist, creating at least one opening through said layer of photoresist that aligns with at least one surface area in the surface of said silicon based layer into which at least one opening is to be etched, said developed layer of photoresist forming an etch mask, exposing the surface of said layer of hardmask material etch the exposed surface of said layer of hardmask material in accordance with said at least one opening through said layer of photoresist, creating at least one opening through said layer of hardmask material remove said photoresist etch mask from the surface of said layer of hardmask material and simultaneously etch through said layer of ARC material in accordance with said at least one opening created through said layer of hardmask material, creating at least one opening through said layer of ARC material etch said silicon based layer of semiconductor material in accordance with said at least one opening created through said layer of hardmask material and said layer of ARC material and remove said patterned layer of hardmask material and said patterned layer of ARC material from the surface of said silicon based layer of semiconductor material.

Yet one more method of the invention for patterning a semiconductor surface by applying etch process can be summarized as follows.

provide a substrate, said substrate having been provided with a oxide based layer of semiconductor material over the surface thereof deposit a layer of Anti Reflective Coating (ARC) over the surface of said oxide based layer of semiconductor material create a hardmask layer over the surface of said layer of ARC material coat a layer of photoresist over the surface of said layer of hardmask material pattern and develop said layer of photoresist, creating at least one opening through said layer of photoresist that aligns with at least one surface area in the surface of said oxide based layer of semiconductor material into which at least one opening is to be etched, said developed layer of photoresist forming an etch mask, exposing the surface of said layer of hardmask material etch the exposed surface of said layer of hardmask material in accordance with said at least one opening through said layer of photoresist, creating at least one opening through said layer of hardmask material remove said photoresist etch mask from the surface of said layer of hardmask material and simultaneously etching through said layer of ARC material in accordance with said at least one opening created through said layer of hardmask material, creating at least one opening through said layer of ARC material etch said oxide based layer of semiconductor material in accordance with said at least one opening created through said layer of hardmask material and said layer of ARC material, and remove said patterned layer of hardmask material and said patterned layer of ARC material from the surface of said oxide based layer of semiconductor material.

The third and fourth embodiments of the invention are not summarized at this time for reasons of brevity and to avoid redundancy. The embodiments have previously been described in detail.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for patterning a semiconductor surface by applying etch processes, comprising:

forming a layer on a substrate;

forming a layer of BARC over the surface of said layer on the substrate;

forming a first hardmask with a first thickness over said layer of BARC;

forming a second hardmask with a second thickness on said first hard mask, the second thickness of the second hard mask being less than the first thickness of the first hard mask, the second hard mask comprising material different than material of the first hardmask, assuring an etch selectivity between the first and the second hard mask;

forming a soft mask over said second hard mask;

patterning and etching the soft mask, exposing the surface of the second hard mask;

etching the exposed surface of the second hard mask, exposing the surface of the first hard mask;

etching the exposed surface of the first hard mask, exposing the surface of the BARC;

etching the exposed surface of the BARC, exposing the layer on the substrate; and etching the exposed surface of the layer on the substrate.

2. The method of claim 1, said first hardmask comprising a material selected from the group consisting of silicon dioxide and silicon nitride and silicon oxynitride and combinations thereof.

3. The method of claim 1, said first thickness of said first hard mask being in the range between about 500 and 9,000 Angstrom.

4. The method of claim 1, said second layer of hardmask comprising a material selected from the group consisting of silicon dioxide and silicon nitride and silicon oxynitride and combinations thereof.

5. The method of claim 1, said second thickness of said second hard mask being in the range between 300 and 6,000 Angstrom.

6. The method of claim 1, said layer of BARC being formed by CVD.

7. The method of claim 6, said layer of BARC comprising amorphous carbon.

* * * * *